(12) United States Patent
Esch

(10) Patent No.: US 11,594,527 B2
(45) Date of Patent: Feb. 28, 2023

(54) SEMICONDUCTOR SUBSTRATE AND SEMICONDUCTOR ARRANGEMENT

(71) Applicant: Infineon Technologies AG, Neubiberg (DE)

(72) Inventor: Juergen Esch, Lippstadt (DE)

(73) Assignee: Infineon Technologies AG, Neubiberg (DE)

( * ) Notice: Subject to any disclaimer, the term of this patent is extended or adjusted under 35 U.S.C. 154(b) by 288 days.

(21) Appl. No.: 16/892,445

(22) Filed: Jun. 4, 2020

(65) Prior Publication Data

US 2020/0388605 A1 Dec. 10, 2020

(30) Foreign Application Priority Data

Jun. 6, 2019 (EP) .................................... 19178600

(51) Int. Cl.
*H01L 25/18* (2006.01)
*H01L 25/065* (2023.01)

(52) U.S. Cl.
CPC .......... *H01L 25/18* (2013.01); *H01L 25/0655* (2013.01)

(58) Field of Classification Search
CPC ....................... H01L 25/18; H01L 25/0655
See application file for complete search history.

(56) References Cited

U.S. PATENT DOCUMENTS

| 6,456,516 | B1 | 9/2002 | Bruckmann et al. |
| 2006/0274561 | A1 | 12/2006 | Ahmed et al. |
| 2011/0117705 | A1* | 5/2011 | Samples ............... H01L 25/072 174/257 |
| 2014/0252410 | A1 | 9/2014 | Laschek-Enders |
| 2017/0179095 | A1 | 6/2017 | Ami |

FOREIGN PATENT DOCUMENTS

DE 102004027186 B3 10/2005
EP 1808954 A2 7/2007

* cited by examiner

*Primary Examiner* — Walter H Swanson
(74) *Attorney, Agent, or Firm* — Murphy, Bilak & Homiller, PLLC

(57) ABSTRACT

A semiconductor substrate includes a dielectric insulation layer and a structured metallization layer having at least five separate sections attached to the dielectric insulation layer, a first switching element having first emitter and collector terminals, a second switching element having second emitter and collector terminals, a first diode element having first anode and cathode terminals, and a second diode element having second anode and cathode terminals. The switching and diode elements are arranged on a first section of the metallization layer, with the collector and cathode terminals electrically coupled to the first section. The first anode and emitter terminals are electrically coupled to second and third sections. The second anode and emitter terminals are electrically coupled to fourth and fifth sections. The first section separates the second and fourth adjacent sections from the third and fifth adjacent sections.

16 Claims, 8 Drawing Sheets

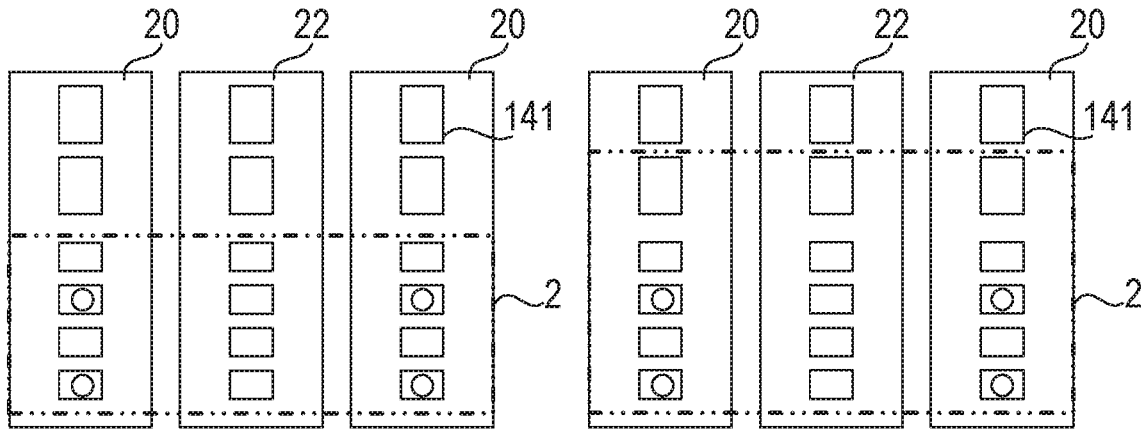
FIG 14A  FIG 14B
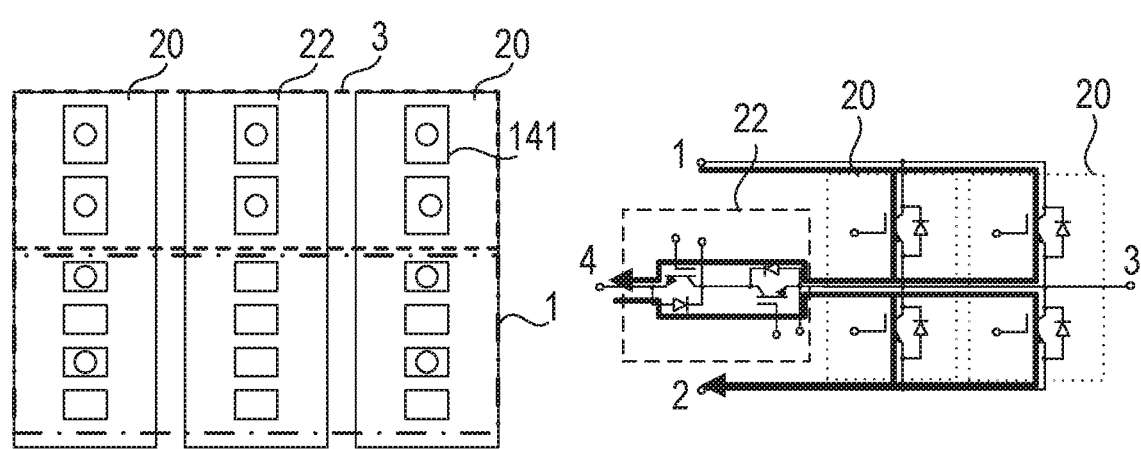
FIG 15
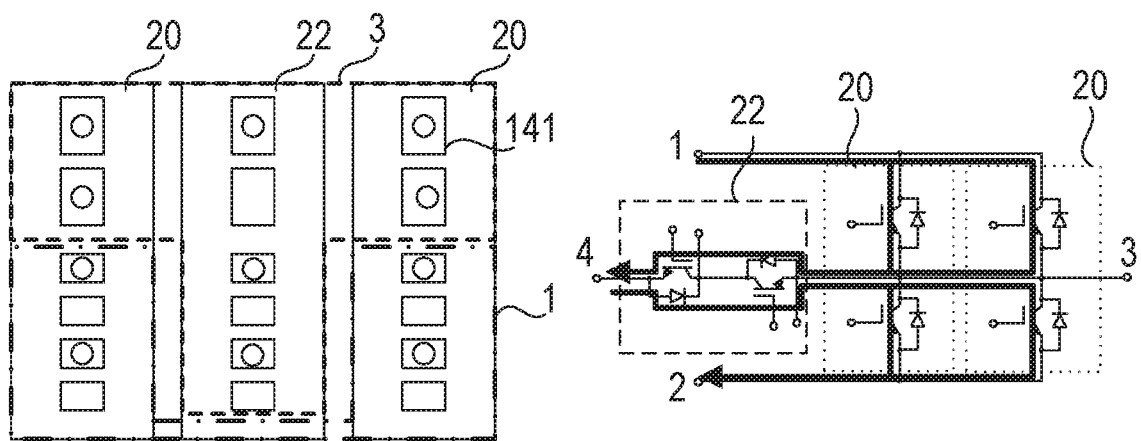
FIG 16

SEMICONDUCTOR SUBSTRATE AND SEMICONDUCTOR ARRANGEMENT

TECHNICAL FIELD

The instant disclosure relates to a semiconductor substrate and to a semiconductor arrangement, in particular a semiconductor arrangement comprising a plurality of semiconductor substrates.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

Electrically conducting terminal elements are usually provided that allow to electrically contact the semiconductor elements from outside the housing. Such electrically conducting terminal elements often include one or more conductor rails, for example. Due to the size of such power semiconductor module arrangements, which are generally designed as small as possible, high stray inductances may occur which may negatively affect the operation of the semiconductor module.

There is a need for a semiconductor substrate and a semiconductor arrangement comprising a plurality of semiconductor substrates with a low stray inductance.

SUMMARY

A semiconductor substrate includes a dielectric insulation layer and a structured first metallization layer attached to the dielectric insulation layer, a first switching element including a first load path between a first emitter terminal and a first collector terminal, a second switching element including a second load path between a second emitter terminal and a second collector terminal, a first diode element including a first anode terminal and a first cathode terminal, and a second diode element including a second anode terminal and a second cathode terminal. The first metallization layer includes at least five separate sections that are dielectrically insulated from each other. The first switching element, the second switching element, the first diode element, and the second diode element are arranged on a first section of the first metallization layer, wherein the first collector terminal, the second collector terminal, the first cathode terminal and the second cathode terminal are electrically coupled to the first section. The first anode terminal and the first emitter terminal are electrically coupled to each other and further to a second section and to a third section of the first metallization layer, and the second anode terminal and the second emitter terminal are electrically coupled to each other and further to a fourth section and to a fifth section of the first metallization layer. The second and the fourth section are arranged adjacent each other, the third and the fifth section are arranged adjacent each other, and the first section separates the second and the fourth section from the third and the fifth section.

A semiconductor arrangement includes a plurality of semiconductor substrates. The plurality of semiconductor substrates is arranged in one row such that the first sections of the first metallization layers of the plurality of semiconductor substrates are arranged in a first row, the second sections and the third sections of the first metallization layer of the plurality of semiconductor substrates are arranged in a second row in parallel to the first row, and the fourth sections and the fifth sections of the first metallization layer of the plurality of semiconductor substrates are arranged in a third row in parallel to the first row and the second row.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIGS. 14A and 14B schematically illustrate the resulting contact sheets in a third layer for the arrangement of FIG. 3 implemented with the semiconductor substrate arrangements of FIGS. 5 and 8 in comparison.

FIG. 15 schematically illustrates the arrangement of FIGS. 12A, 13A and 14A, and the resulting current directions in the arrangement of FIG. 3.

FIG. 16 schematically illustrates the arrangement of FIGS. 12B, 13B and 14B, and the resulting current directions in the arrangement of FIG. 3.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
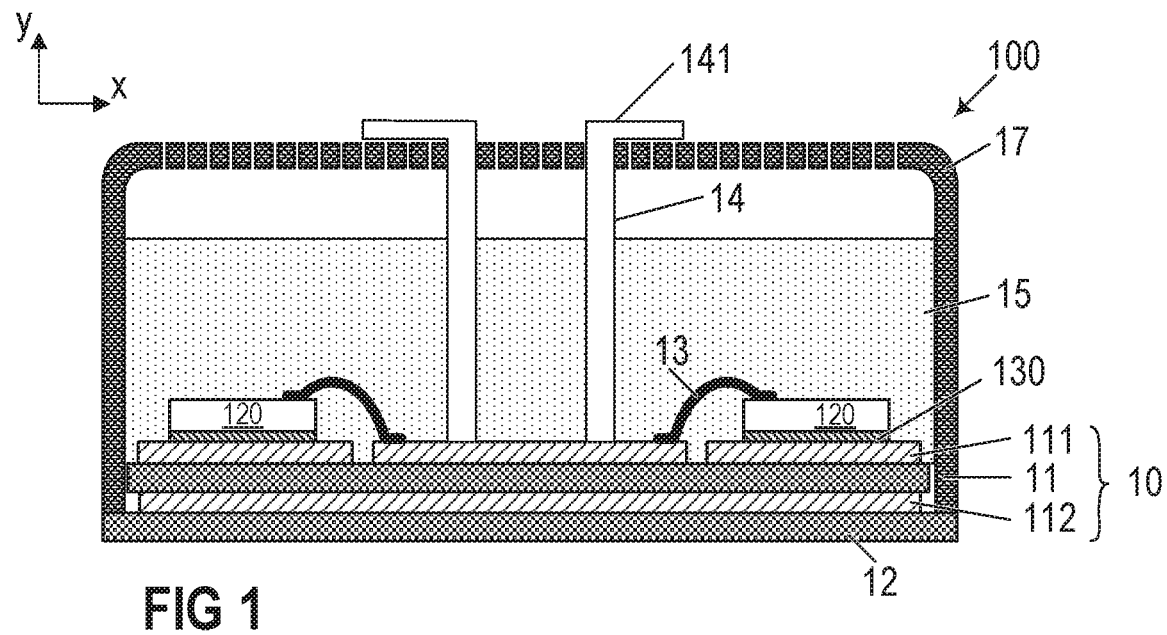
FIG. 1 is a cross-sectional view of a power semiconductor module arrangement.

Referring to FIG. 1, a cross-sectional view of a power semiconductor module arrangement 100 is schematically illustrated. The power semiconductor module arrangement 100 includes a housing 17 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide: aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BrN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 17. In the example illustrated in FIG. 1, the semiconductor substrate 10 is arranged on a base plate 12 which forms a ground surface of the housing 17, while the housing 17 itself solely comprises sidewalls and a cover. This is, however, only an example. It is also possible that the housing 17 further comprises a ground surface and the semiconductor substrate 10 and the base plate 12 be arranged inside the housing 17. In some power semiconductor module arrangements 100, more than one semiconductor substrate 10 is arranged on a single base plate 12 or on the ground surface of a housing 17.

One or more semiconductor bodies 120 may be arranged on the at least one semiconductor substrate 10. Each of the semiconductor bodies 120 arranged on the at least one semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 120 may form a semiconductor arrangement on the semiconductor substrate 10. In FIG. 1, only two semiconductor bodies 120 are exemplarily illustrated. The second metallization layer 112 of the semiconductor substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 120 may be mounted to the same or to different sections of the first metallization layer 111. Different sections of the first metallization layer 111 may have no electrical connection or may be electrically connected to one or more other sections using, e.g., bonding wires 13. Electrical connections 13 may also include connection plates or conductor rails, for example, to name just a few examples. The one or more semiconductor bodies 120 may be electrically and mechanically connected to the semiconductor substrate 10 by an electrically conductive connection layer 130. Such an electrically conductive connection layer may be a solder layer, a layer of an electrically conductive adhesive, or a layer of a sintered metal powder, e.g., a sintered silver powder, for example.

According to other examples, it is also possible that the second metallization layer 112 is a structured layer. It is further possible to omit the second metallization layer 112 altogether. It is generally also possible that the first metallization layer 111 is a continuous layer, for example.

The power semiconductor module arrangement 100 illustrated in FIG. 1 further includes terminal elements 14. The terminal elements 14 are electrically connected to the first metallization layer 111 and provide an electrical connection between the inside and the outside of the housing 17. The terminal elements 14 may be electrically connected to the first metallization layer 111 with a first end, while a second end 141 of each of the terminal elements 14 protrudes out of the housing 17. The terminal elements 14 may be electrically contacted from the outside at their respective second ends 141. A first part of the terminal elements 14 may extend through the inside of the housing 17 in a vertical direction y. The vertical direction y is a direction perpendicular to a top surface of the semiconductor substrate 10, wherein the top surface of the semiconductor substrate 10 is a surface on which the at least one semiconductor body 120 is mounted. The terminal elements 14 illustrated in FIG. 1, however, are only examples. Terminal elements 14 may be implemented in any other way and may be arranged anywhere within the housing 17. For example, one or more terminal elements 14 may be arranged close to or adjacent to the sidewalls of the housing 17. Terminal elements 14 could also protrude through the sidewalls of the housing 17 instead of through the cover.

The semiconductor bodies 120 each may include a chip pad metallization (not specifically illustrated), e.g., a source, drain, emitter, collector, anode, cathode or gate metallization. A chip pad metallization generally provides a contact surface for electrically connecting the semiconductor body 120. The chip pad metallization may electrically contact a connection layer 130, a terminal element 14, or an electrical connection 13, for example. A chip pad metallization may consist of or include a metal such as aluminum, copper, gold or silver, for example. The electrical connections 13 and the terminal elements 14 may also consist of or include a metal such as copper, aluminum, gold, or silver, for example.

Figure 2:
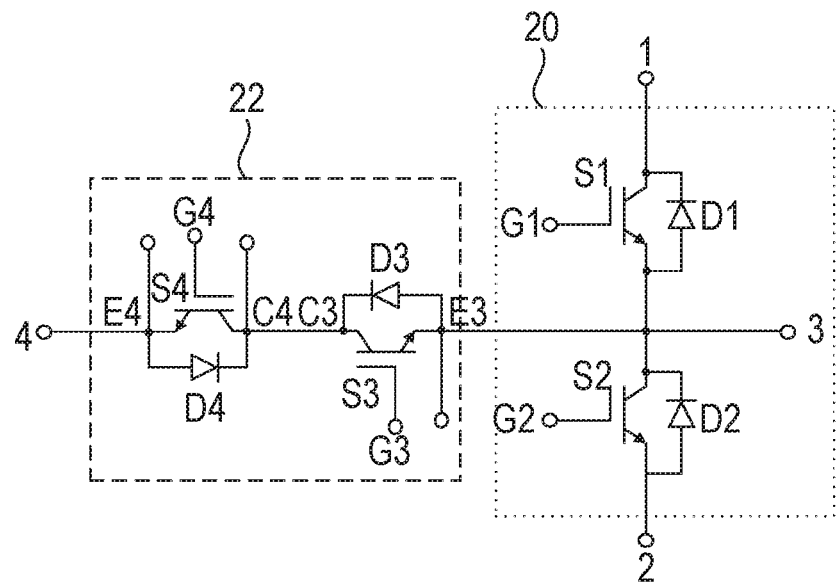
FIG. 2 schematically illustrates a circuit arrangement according to one example.

Now referring to FIG. 2 and as has been mentioned above, the at least two semiconductor bodies 120 may be arranged in a semiconductor arrangement such as a neutral point clamped (NPC) topology (e.g., so-called NPC2, T-type, MNPC, or NPC3 topology), for example. FIG. 2 is a circuit diagram of an exemplary three-level NPC2 topology. The NPC2 topology of FIG. 2 comprises a half-bridge module 20 and a common collector module 22. A typical NPC topology comprises four switching elements S1, S2, S3, S4 such as IGBTs, for example, and four diode elements D1, D2, D3, D4.

The half-bridge module 20 is configured to convert a DC voltage provided at an input 1, 2 of the half-bridge module 20 into an AC voltage provided at an output node 3 of the half-bridge module 20. The AC voltage may be provided to, e.g., a load (not illustrated) that is coupled to the output node 3 of the half-bridge module 20. The half-bridge module 20 is coupled between a first supply node 1 which is configured to be operatively coupled to a first electrical potential and a second supply node 2 which is configured to be operatively coupled to a second electrical potential. The first electrical potential may be a positive potential DC+ and the second electrical potential may be a negative potential DC− to supply a DC voltage via the first and second supply nodes 1, 2. The first and second supply nodes 1, 2 form the input of the half-bridge module 20.

The half-bridge module 20 may include one high-side switch S1 (first switch) and one low-side switch S2 (second switch) coupled in series to each other and between the first supply node 1 and the second supply node 2. The half-bridge module 20 may be configured to drive a load (not specifically illustrated) at its output node 3. The load may be an inductive load, for example. The output node 3 is electrically connected to a common node between the high-side switch S1 and the low-side switch S2.

In the circuit arrangement of FIG. 2, each switch S1, S2 of the half-bridge module 20 is implemented as an IGBT (insulated-gate bipolar transistor). Each of the switches S1, S2 may comprise an external freewheeling diode D1, D2 coupled in parallel to the respective switch S1, S2. According to another example, each of the switches S1, S2 comprises two or more separate switching elements electrically coupled in parallel to each other (not illustrated).

Each of the first switch S1 and the second switch S2 includes a control electrode G1, G2 and a controllable load path between a first load electrode (e.g., emitter electrode) and a second load electrode (e.g., collector electrode). The load paths of the first switch S1 and the second switch S2 are coupled in series and between the first supply node 1 and the second supply node 2.

The common collector module 22 comprises a third switching element S3, a fourth switching element S4, a third diode D3, and a fourth diode D4. Each of the third switch S3 and the fourth switch S4 includes a control electrode G3, G4 and a controllable load path between a first load electrode E3, E4 (e.g., emitter electrode) and a second load electrode C3, C4 (e.g., collector electrode). The load paths of the third switch S3 and the fourth switch S4 are coupled in series between a fourth neutral node 4 and the output node 3. In this series connection of the third switch S3 and the fourth switch S4, the second load electrode C3 of the third switch S3 is coupled to the second load electrode C4 of the fourth switch S4. The first load electrode E3 of the third switch S3 is coupled to the output node 3, and the first load electrode E4 of the fourth switch S4 is coupled to the fourth neutral node 4. The third diode element D3 is coupled in parallel to the third switch S3 between the output node 3 and the fourth switch S4, wherein an anode of the third diode element D3 is coupled to the output node 3, and a cathode of the third diode element D3 is coupled to the second load electrode C4 of the fourth switch S4. The fourth diode element D4 is coupled in parallel to the fourth switch S4 between the fourth neutral node 4 and the second load electrode C3 of the third switch S3, wherein an anode of the fourth diode element D4 is coupled to the fourth neutral node 4, and a cathode of the fourth diode element D4 is coupled to the second load electrode C3 of the third switch S3.

A current commutation path of the semiconductor arrangement of FIG. 2 runs through both of the half-bridge module 20 and the common collector module 22. In particular, a commutation path may run from the first supply node 1 through the first switch S1 and further through the third switch S3 and the fourth switch S4 to the fourth neutral node 4.

A three-level NPC topology generally has a stray inductance which is higher than the stray inductance of a two-level topology (two-level topology not specifically illustrated). The losses during the use of a three-level topology are generally increased as compared to, e.g., two-level topologies.

Figure 3:
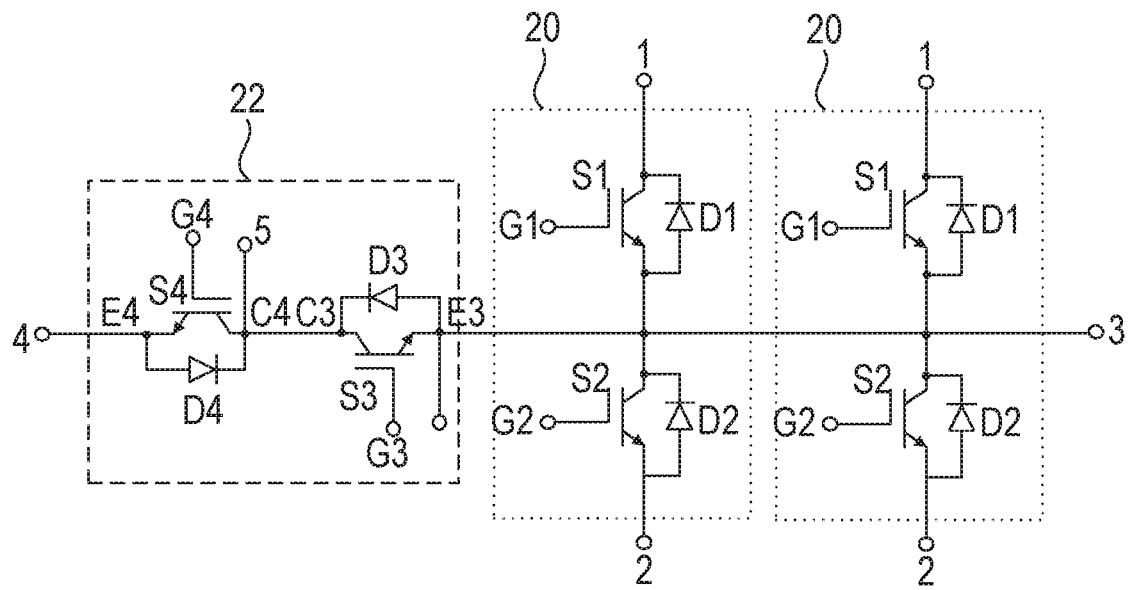
FIG. 3 schematically illustrates another circuit arrangement according to one example.

Three-level NPC topologies may generally be provided in different expansion levels. A higher order expansion level is illustrated in FIG. 3, for example. The semiconductor arrangement in this example comprises two half-bridge modules 20 and one common collector module 22. The two half-bridge modules 20 are coupled in parallel between the first supply node 1 and the second supply node 2. The individual half-bridge modules 20 of FIG. 3 each correspond to the single half-bridge module 20 of FIG. 2, and the common collector module 22 of FIG. 3 corresponds to the common collector module 22 of FIG. 2.

Each of the half-bridge and common collector modules 20, 22 may be arranged in a separate housing, for example. That is, each half-bridge module 20 may be arranged in a housing 17 similar to what has been described with respect to FIG. 1 above. The same applies for the common collector module 22. In practice, the common collector module 22 of FIG. 3 may be arranged between the two half-bridge modules 20, as is exemplarily illustrated in FIG. 4, which schematically illustrates a top view of a power semiconductor module arrangement comprising three individual power semiconductor modules (three housings 17). In the top view of FIG. 4, the housings of the individual modules 20, 22 are schematically illustrated with the second ends 141 of the respective terminal elements 14 protruding out of the housings. Electrical connections between the individual second ends 141 outside the housings are also schematically illustrated in FIG. 4. Such electrical connection may be implemented by means of contact sheets, for example (contact sheets not illustrated in the example of FIG. 4).

As has been described with respect to FIG. 1 above, each of the modules 20, 22 may comprise one or more semiconductor substrates 10 arranged in a housing 17. A conventional semiconductor substrate 10 that may be arranged in the housing of the common collector module 22 is exemplarily illustrated in FIG. 5. As has been described above, the semiconductor substrate 10 comprises a structured first metallization layer 111. The third switch S3, the third diode element D3, the fourth switch S4, and the fourth diode element D4 are arranged on a first section $111_2$ of the first metallization layer 111. In particular, the first section $111_2$ of the first metallization layer 111 may form a common collector of the semiconductor arrangement. That is, a second load electrode C3 of the third switch, a second load electrode C4 of the fourth switch, a cathode of the third diode element D3, and a cathode of the fourth diode element D4 may be coupled to the first section 112 of the first metallization layer 111. A first load electrode E3 of the third switch S3, and an anode electrode of the third diode element D3 are electrically coupled to each other as well as to a second section $111_1$ of the first metallization layer 111. A first load electrode E4 of the fourth switch S4, and an anode electrode of the fourth diode element D4 are electrically coupled to each other as well as to a third section $111_3$ of the first metallization layer 111. The electrical connections between the first load electrodes E3, E4, the anode electrodes, and the second and third section $111_1$, $111_3$ of the first metallization layer 111 may include one or more bonding wires 60, for example. This, however, is only an example. Any other kind of electrical connections such as bonding ribbons may be used instead.

Figure 6:
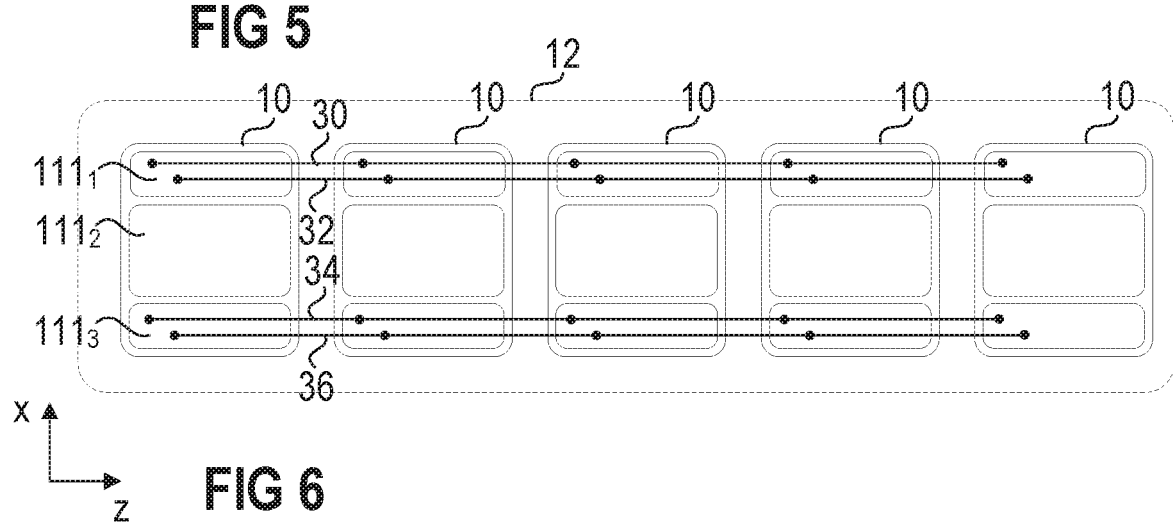
FIG. 6 schematically illustrates a top view of an arrangement comprising a plurality of semiconductor substrates of FIG. 5.

A power semiconductor module arrangement comprising a plurality of semiconductor substrates 10 on a single base plate 12 is exemplarily illustrated in FIG. 6. The base plate 12 with the plurality of semiconductor substrates 10 mounted thereon may be arranged in a housing (housing not specifically illustrated in FIG. 6. The semiconductor devices S3, D3, S4, D4 are not specifically illustrated in the example of FIG. 6 for convenience only. The top view illustrated in FIG. 6 rather aims at illustrating electrical connections between the different semiconductor modules 10 of the arrangement. Such electrical connections are schematically illustrated in continuous lines in FIG. 6. Usually, two electrical connections are formed between the second sections $111_1$ of the different semiconductor substrates 10, and two electrical connections are formed between the third sections $111_3$ of the different semiconductor substrates 10.

The different second and third sections $111_1$, $111_3$ of the first metallization layers 111 may be electrically contacted by means of conductor rails, for example. This is exemplarily illustrated in FIG. 7. A first and a second conductor rail 30, 32 may be provided in order to electrically contact the second sections $111_1$ of the different semiconductor substrates 10. A third and a fourth conductor rail 34, 36 may be provided in order to electrically contact the third sections $111_3$ of the different semiconductor substrates 10.

The first and the second conductor rails 30, 32 which electrically contact the same sections (i.e., second sections $111_1$) of the separate first metallization layers 111 inevitably comprise the same electrical potential. The same applies for the third and the fourth conductor rails 34, 36 which electrically contact the third sections $111_3$ of the separate first metallization layers 111. That is, the first and the second conductor rails 30, 32 are arranged adjacent to each other within close distance, and the third and fourth conductor rails 34, 36 are arranged adjacent to each other within close distance. In other words, a distance between the first and the second conductor rail 30, 32 in the first horizontal direction x is smaller than a distance between first conductor rail 30 or the second conductor rail 32 and the third conductor rail 34 or the fourth conductor rail 36 in the same direction. This arrangement with two conductor rails 30, 32 and 34, 36 of the same potential arranged in close proximity to each other results in a comparably high stray inductance.

Figure 7:
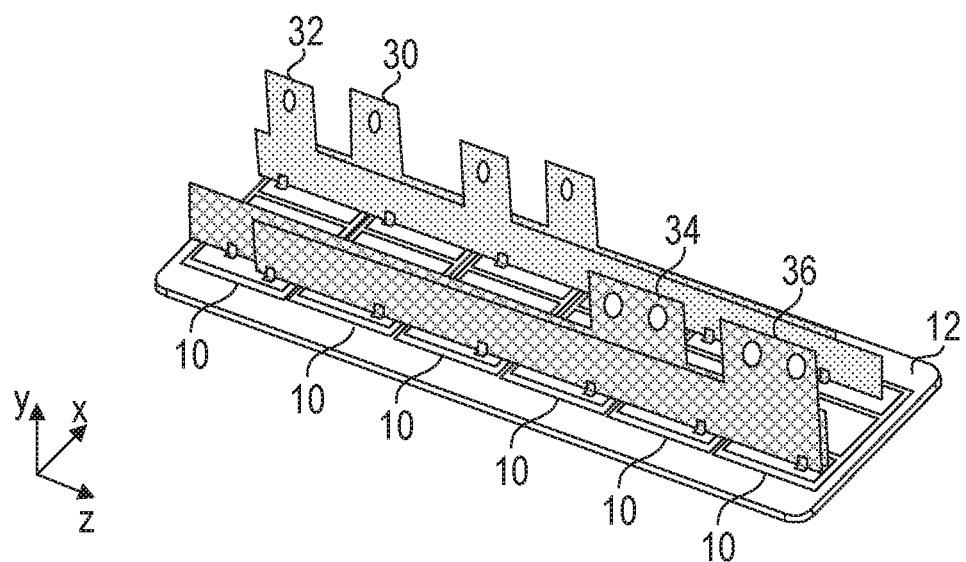
FIG. 7 schematically illustrates a dimensional view of an arrangement comprising a plurality of semiconductor substrates of FIG. 5.
Figure 8:
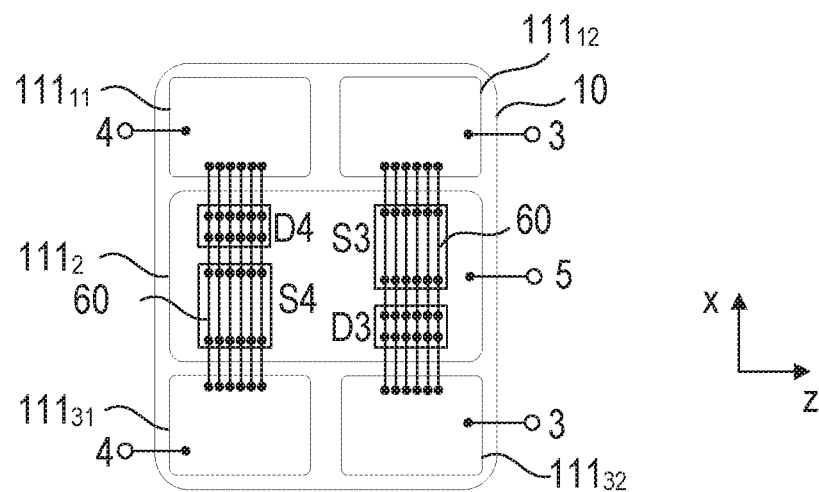
FIG. 8 schematically illustrates a top view of a semiconductor substrate with a plurality of semiconductor devices mounted thereon according to one example.

A semiconductor arrangement having a reduced stray inductance with regard to the arrangement of FIGS. 6 to 7 is schematically illustrated in FIG. 8. In this embodiment, the first metallization layer 111 comprises a first section $111_2$, a second section $111_{12}$, a third section $111_{32}$, a fourth section $111_{11}$, and a fifth section $111_{31}$. Additional sections $111_{nm}$ are generally possible. For example, additional elements such as capacitors may be arranged on any additional sections $111_{nm}$. Such optional additional sections $111_{nm}$, however, are not relevant for the understanding of the present invention and are, therefore, not specifically illustrated herein. Similar to the example illustrated in FIG. 5, the third switch S3, the third diode element D3, the fourth switch S4, and the fourth diode element D4 are arranged on the first section $111_2$ of the first metallization layer 111. In particular, the first section $111_2$ of the first metallization layer 111 may form a common collector of the semiconductor arrangement. That is, a second load electrode C3 of the third switch S3, a second load electrode C4 of the fourth switch S4, a cathode of the third diode element D3, and a cathode of the fourth diode element D4 may be electrically coupled to the first section $111_2$ of the first metallization layer 111. One of a plurality of electrically conductive connection layers 130 may be arranged between each of the switching devices S3, S4 and diode devices D3, D4 and the first metallization layer 111, for example. For example, a first electrically conductive connection layer 130 may be arranged between a second load electrode C3 of the third switch S3 and the first section $111_2$, a second electrically conductive connection layer 130 may be arranged between a second load electrode C4 of the fourth switch S4 and the first section $111_2$, a third electrically conductive connection layer 130 may be arranged between a cathode electrode C3 of the third diode element D3 and the first section $111_2$, and a fourth electrically conductive connection layer 130 may be arranged between a cathode electrode C4 of the fourth diode element D4 and the first section $111_2$. A first load electrode E3 of the third switch S3, and an anode electrode of the third diode element D3 are electrically coupled to each other as well as to the second section $111_{12}$ and further to the third section $111_{32}$ of the first metallization layer 111. A first load electrode E4 of the fourth switch S4, and an anode electrode of the fourth diode element D4 are electrically coupled to each other as well as to the fourth section $111_{11}$ and further to the fifth section $111_{31}$ of the first metallization layer 111.

In the example of FIG. 8, therefore, the second section $111_{12}$ and the third section $111_{32}$ are both coupled to the same first potential, and the fourth section $111_{11}$ and the fifth section $111_{31}$ are coupled to the same second potential which is different from the first potential. In particular, the second section $111_{12}$ and the third section $111_{32}$ may be electrically coupled to the output node 3, and the fourth section $111_{11}$ and the fifth section $111_{31}$ may be electrically coupled to the fourth neutral node 4.

Again referring to FIG. 5, the second section $111_1$ which has the first potential (coupled to output node 3) is arranged at a first end of the semiconductor substrate 10, and the third section $111_3$, which has the second potential (coupled to the fourth neutral node 4) is arranged at a second end of the semiconductor substrate 10, opposite to the first end. That is, in the arrangement of FIG. 5, the first section $111_2$ separates the second section $111_1$ and the third section $111_3$, and therefore the first potential and the second potential. In contrast to that, in the arrangement illustrated in FIG. 8 the second section $111_{12}$ and the fourth section $111_{11}$, which have different potentials, are arranged at the first end of the semiconductor substrate 10. The third section $111_{32}$ and the fifth section $111_{31}$, which also have different potentials, are arranged at the second end of the semiconductor substrate 10, opposite to the first end. The first section $111_2$ in the arrangement of FIG. 8 separates the second section $111_{12}$ and the fourth section $111_{11}$ at the first end of the semiconductor substrate 10 from the third section $111_{32}$ and the fifth section $111_{31}$ at the second end of the semiconductor substrate 10.

In this way, when a plurality of semiconductor substrates 10 is arranged adjacent to each other in one row on a base plate 12, the arrangement of the conductor rails 30, 32, 34, 36 differs from the arrangement as has been described with respect to FIGS. 6 and 7 above. Now referring to FIG. 9, a plurality of semiconductor substrates 10 according to the example of FIG. 8 are schematically illustrated on one base plate 12. The plurality of semiconductor substrates 10 is arranged in one row on the base plate 12 such that the first sections $111_2$ of the first metallization layers 111 of the semiconductor substrates 10 are arranged adjacent to each other in a first row. The second sections $111_{12}$ and the fourth sections 111u are arranged adjacent to each other in a second row in parallel to the first row. The second sections $111_{12}$ and the fourth sections $111_{11}$ are arranged alternatingly within the second row. The third sections $111_{32}$ and the fourth sections $111_{31}$ are arranged adjacent to each other in a third row parallel to the first and the second row. The third sections $111_{32}$ and the fifth sections $111_{31}$ are arranged alternatingly within the third row.

A first conductor rail 30 electrically couples the second sections $111_{12}$ of the plurality of semiconductor substrates 10 to each other and to the output node 3. A second conductor rail 32 electrically couples the fifth sections $111_{31}$ of the plurality of semiconductor substrates 10 to each other and to the fourth neutral node 4. A third conductor rail 34 electrically couples the fourth sections $111_{11}$ of the plurality of semiconductor substrates 10 to each other and to the fourth neutral node 4. A fourth conductor rail 36 electrically couples the third sections $111_3$ of the plurality of semiconductor substrates 10 to each other and to the output node 3.

Figure 9:
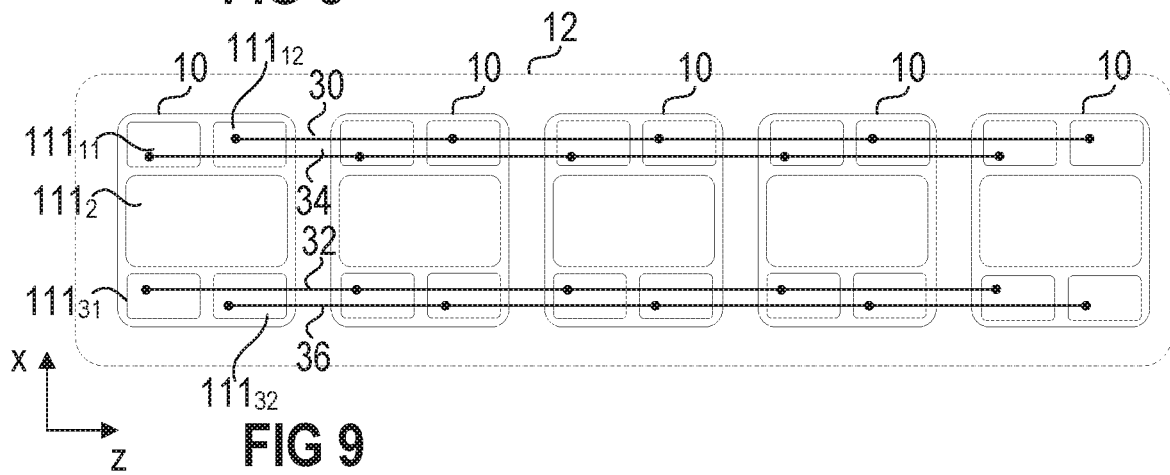
FIG. 9 schematically illustrates a top view of an arrangement comprising a plurality of semiconductor substrates of FIG. 8.
Figure 10:
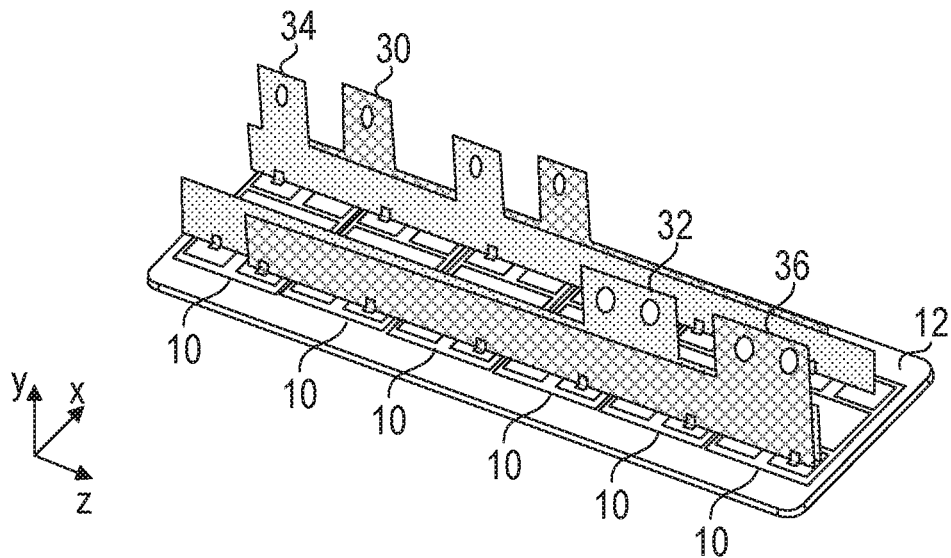
FIG. 10 schematically illustrates a dimensional view of an arrangement comprising a plurality of semiconductor substrates of FIG. 8.

Now referring to FIG. 10, the first conductor rail 30 and the third conductor rail 34 which have different potentials are arranged adjacent to each other at the first end of the semiconductor substrates 10. Further, the second conductor rail 32 and the fourth conductor rail 36 which have different potentials are arranged adjacent to each other at the second end of the semiconductor substrates 10 opposite to the first end. The third conductor rail 34 and the second conductor rail 32 are arranged between the first conductor rail 30 and the fourth conductor rail 36. A distance between the first conductor rail 30 and the third conductor rail 34 in the first horizontal direction x is significantly shorter, e.g., less than 50%, less than 30% or less than 15%, than a distance between the third conductor rail 34 and the second conductor rail 32 in the same direction. Further, a distance between the second conductor rail 32 and the fourth conductor rail 36 in the first horizontal direction x is significantly shorter, e.g., less than 50%, less than 30% or less than 15%, than the distance between the third conductor rail 34 and the second conductor rail 32. The first section $111_2$ of the first metallization layer 111 is arranged between the third conductor rail 34 and the second conductor rail 32. That is, in contrast to the arrangement of FIGS. 6 and 7, in the arrangement of FIGS. 9 and 10 conductor rails having different potentials (i.e., conductor rails 30 and 34, and conductor rails 32 and 36) are arranged in close proximity to each other. This significantly reduces the stray inductance of the semiconductor arrangement.

Figure 5:
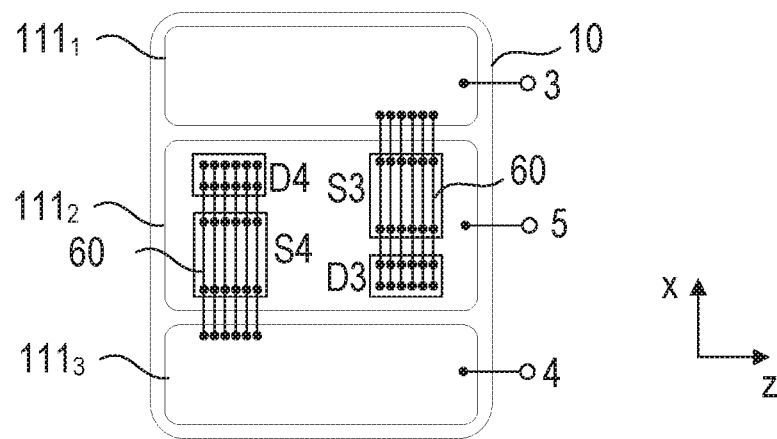
FIG. 5 schematically illustrates a top view of a conventional semiconductor substrate with a plurality of semiconductor devices mounted thereon.
Figure 11A:
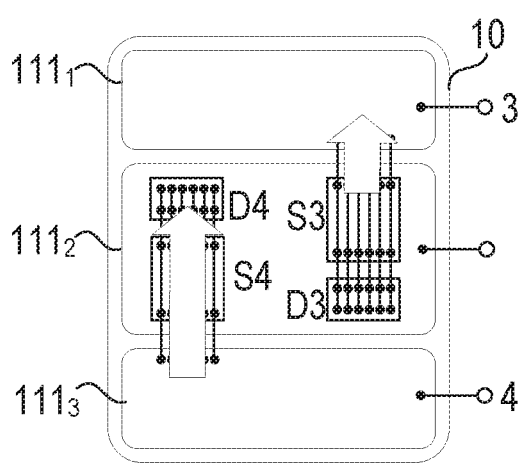
FIGS. 11A and 11B schematically illustrate the arrangements of FIGS. 5 and 8 and their corresponding current directions in comparison.
Figure 11B:
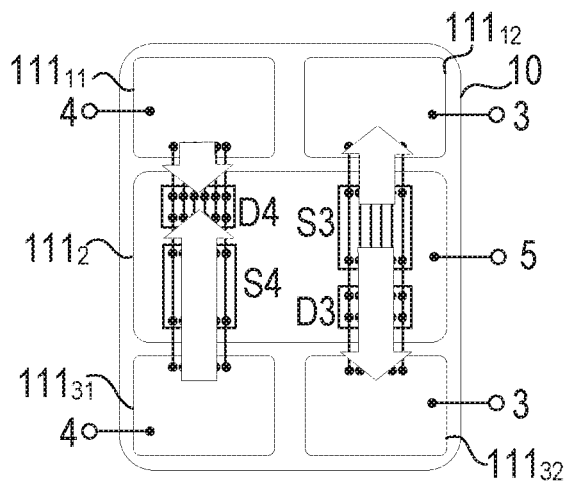

Now referring to FIGS. 11A-11B, the general directions of current flow in the arrangements of FIGS. 5 and 8 are schematically illustrated. In particular, FIG. 1A schematically illustrates the current flow in the arrangement of FIG. 5. The current flow is indicated with bold arrows in FIG. 11A. A first current flows from the third section $111_3$ through the electrical connections 60 to the anode electrode of the fourth diode element D4. The current further flows through the fourth diode element D4 and through the first section $111_2$ to the third switch S3. The current then flows through the third switch S3. From the first load electrode E3 of the third switch S3 the current then flows to the second section $111_1$. In the arrangement of FIG. 11A, no current flows through the fourth switch S4 and through the third diode element D3. A current, however, flows through the electrical connections 60 electrically coupling the fourth diode element D4 to the third section $111_3$ via the first load electrode E4 of the fourth switch S4.

Now referring to FIG. 11B, a current flow in the arrangement of FIG. 8 is schematically illustrated. The current flow in FIG. 11B is also illustrated in bold arrows. A current flows from the fourth section $111_{11}$ and the fifth section $111_{31}$ to the anode electrode of the fourth diode element D4. The current then flows through the fourth diode element D4 and further through the first section $111_2$ to the third switch S3. The current then flows through the third switch S3. From the first load electrode E3 of the third switch S3, the current then flows to the second section $111_{12}$ and the third section $111_{32}$. In the arrangement of FIG. 11B, no current flows through the fourth switch S4 and through the third diode element D3. A current, however, flows through the electrical connections 60 electrically coupling the fourth diode element D4 to the fifth section $111_{31}$ via the first load electrode E4 of the fourth switch S4. Further, a current flows through the electrical connections 60 electrically coupling the first load electrode E3 of the third switch S3 to the third section $111_{32}$ via the anode electrode of the third diode element D3.

Each of the individual conductor rails 30, 32, 34, 36 may comprise one or more taps. In a second horizontal direction z, taps of different potentials may be arranged alternatingly. This is schematically illustrated in FIG. 10. In the example of FIG. 10, the conductor rails 30, 36 having a first potential are marked in a diamond pattern, while the conductor rails 32, 34 having a second potential are marked in a dotted design. In the example of FIG. 10, the first conductor rail 30 and the third conductor rail 34 each comprise two taps. The second conductor rail 32 and the fourth conductor rail 36 each comprise one tap. The taps may correspond to the second ends 141 of the terminal elements 14 of FIG. 1. In the example of FIG. 10, the taps extend in the vertical direction y. This, however, is only an example. The taps may be bent at a later stage such that they extend in the first horizontal direction x, similar to the second ends 141 of the terminal elements 14 of FIG. 1. This generally makes it easier to contact the taps. For example, each of the taps may comprise a hole. A screw may be inserted into each of the holes within the taps in order to electrically contact the conductor rails.

According to one example, one of a plurality of contact sheets may be coupled to the at least one tap of the first conductor rail 30, another one of the plurality of contact sheets may be coupled to the at least one tap of the second conductor rail 32, another one of the plurality of contact sheets may be coupled to the at least one tap of the third conductor rail 34, and another one of the plurality of contact sheets may be coupled to the at least one tap of the fourth conductor rail 36. The contact sheets may be arranged in different layers above the housing of the power semiconductor module arrangement. The contact sheets may be arranged in parallel to the top surfaces of the plurality of semiconductor substrates 10.

Figure 4:
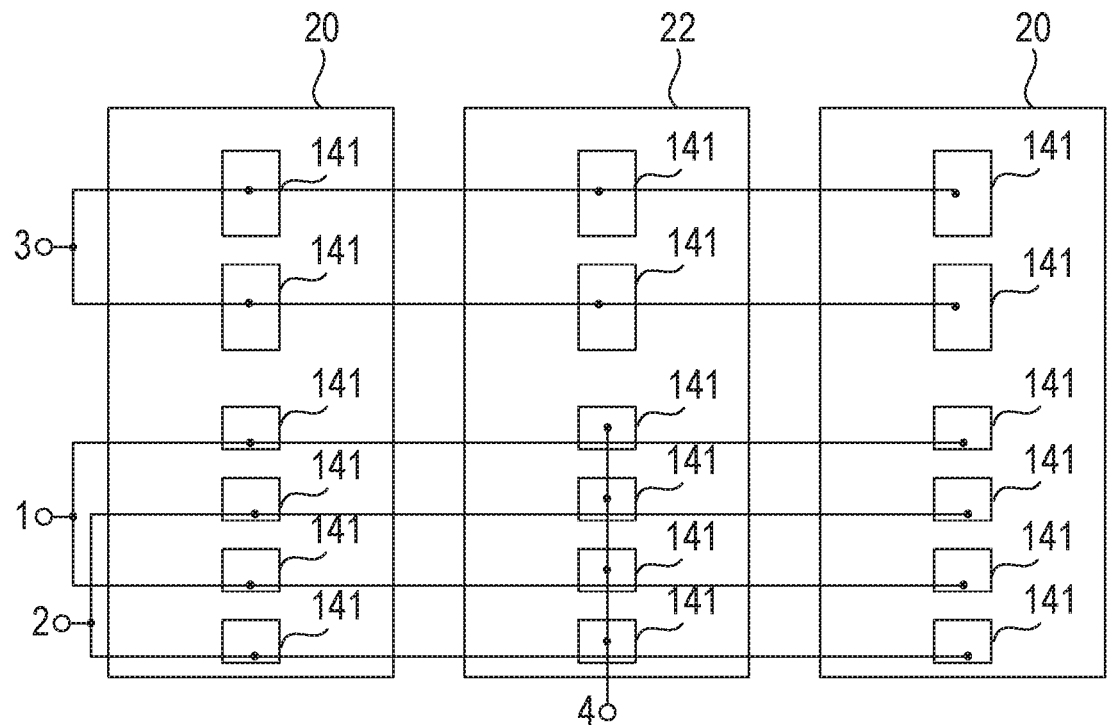
FIG. 4 schematically illustrates an arrangement comprising three separate power semiconductor module arrangements.
Figure 12A:
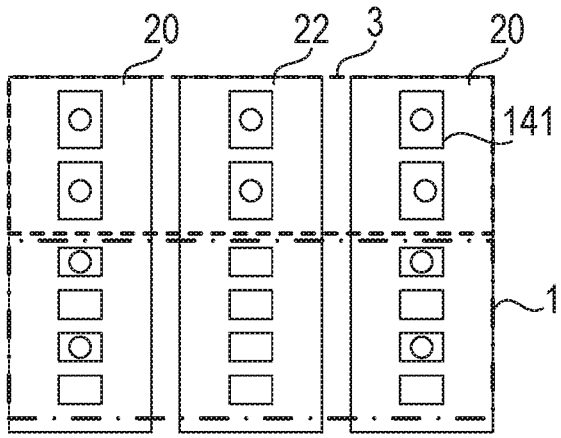
FIGS. 12A and 12B schematically illustrate the resulting contact sheets in a first layer for the arrangement of FIG. 3 implemented with the semiconductor substrate arrangements of FIGS. 5 and 8 in comparison.
Figure 12B:
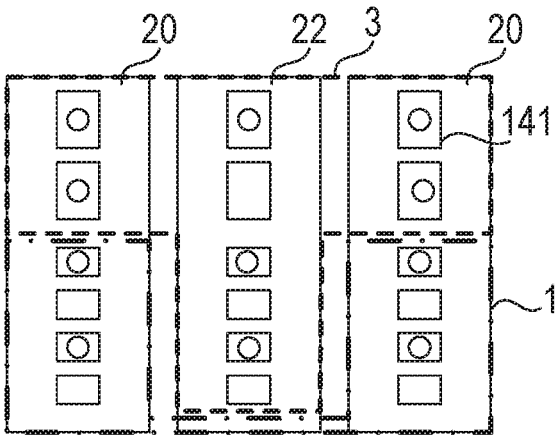

The different layers of contact sheets in an arrangement of FIG. 4, that is, with two half-bridge modules 20 arranged on both sides of a common collector module 22, are exemplarily illustrated in FIGS. 12A-12B, 13A-13B and 14A-14B. FIG. 12A schematically illustrates a first layer of contact sheets when the common collector module of FIGS. 5 to 7 is used in the arrangement of FIG. 4. This first layer comprises two contact sheets, a first contact sheet electrically contacting those taps that are to be connected to the output node 3, and a second contact sheet electrically contacting those taps that are to be connected to the first supply node 1. The two contact sheets in the arrangement of FIG. 12A are rectangular contact sheets. The form of the contact sheets in the arrangement of FIG. 4 is different, if the common collector module 22 of FIGS. 8 to 10 is used instead. This is schematically illustrated in FIG. 12B. The first contact sheet in this example is T-shaped, while the second contact sheet is U-shaped. The T-shape of the first contact sheet results from the alternating arrangement of the taps of different potentials (see FIG. 10). In FIGS. 12A-12B, the taps (or second ends 141) that are electrically coupled to the respective contact sheet are marked with circles which represent the holes in the taps.

Figure 13A:
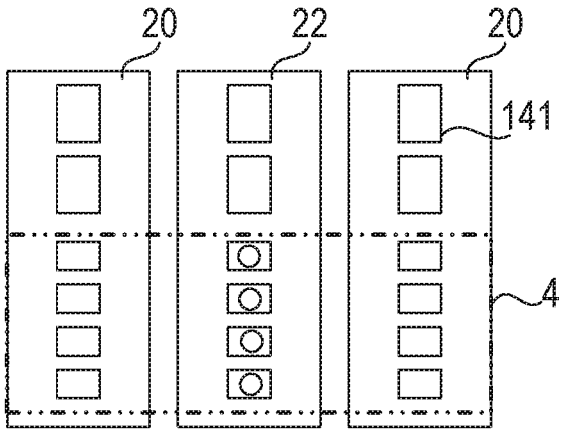
FIGS. 13A and 13B schematically illustrate the resulting contact sheets in a second layer for the arrangement of FIG. 3 implemented with the semiconductor substrate arrangements of FIGS. 5 and 8 in comparison.
Figure 13B:
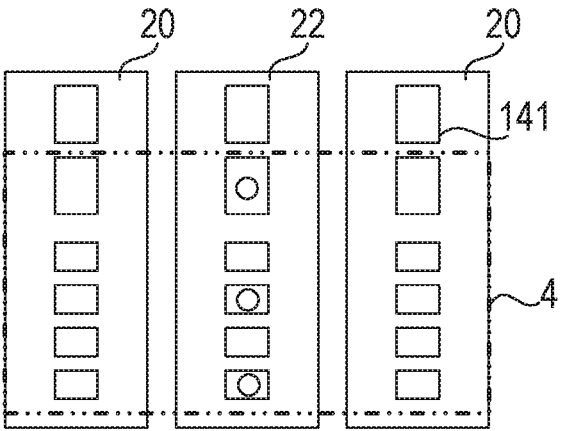

A second layer may comprise a single third contact sheet electrically contacting those taps that are to be connected to the fourth neutral node 4. As can be seen in FIGS. 13A and 13B, the size of the rectangular contact sheet increases when the common collector module 22 of FIGS. 8 to 10 is used (see FIG. 13B) as compared to an arrangement wherein the common collector module 22 of FIGS. 5 to 7 is used (see FIG. 13A). This, again, results from the alternating arrangement of the taps within the common collector module 22 of FIGS. 8 to 10.

A third layer may comprise a further fourth contact sheet electrically contacting those taps that are to be connected to the second input node 2. This is schematically illustrated in FIG. 14A (when using arrangement of FIGS. 5 to 7) and 14B (when using arrangement of FIGS. 8 to 10). As can be seen, the fourth contact sheet electrically contacts the half-bridge modules 20, but not the common collector module 22. The size of the fourth contact sheet, however, may still differ for the different arrangements.

The electrical contacts may be somewhat more complex when using the common collector module 22 of FIGS. 8 to 10, as compared to an arrangement using the common collector module of FIGS. 5 to 7. However, the increased complexity may be acceptable with regard to the decreased stray inductance.

Now referring to FIG. 15, the current paths in the arrangement of FIG. 3 are exemplarily illustrated when the common collector module 22 of FIGS. 5 to 7 is used. The resulting stray inductance in the upper path between the first supply node 1 and the fourth neutral node 4 may be about 33.6 nH, for example. The resulting stray inductance in the lower path between the fourth neutral node 4 and the second input node 2 may be about 34.1 nH, for example.

Now referring to FIG. 16, the current paths in the arrangement of FIG. 3 are exemplarily illustrated when the common collector module 22 of FIGS. 8 to 10 is used. The resulting stray inductance in the upper path between the first supply node 1 and the fourth neutral node 4 may be about 14.7 nH, for example. The resulting stray inductance in the lower path between the fourth neutral node 4 and the second input node 2 may be about 15.6 nH, for example. As can be seen, the stray inductance in the arrangement of FIG. 16 is less than half of the stray inductance in the arrangement of FIG. 15.

Figure 17:
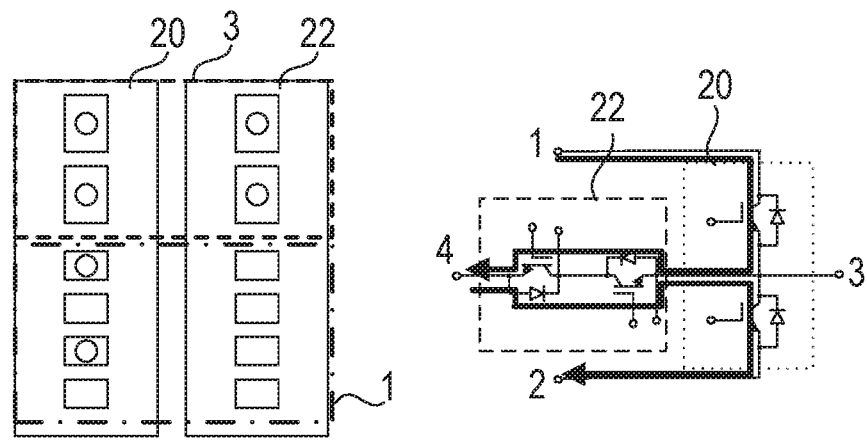
FIG. 17 schematically illustrates the arrangement of FIGS. 12A, 13A and 14A with a single half-bridge module, and the resulting current directions in the arrangement of FIG. 2.
Figure 18:
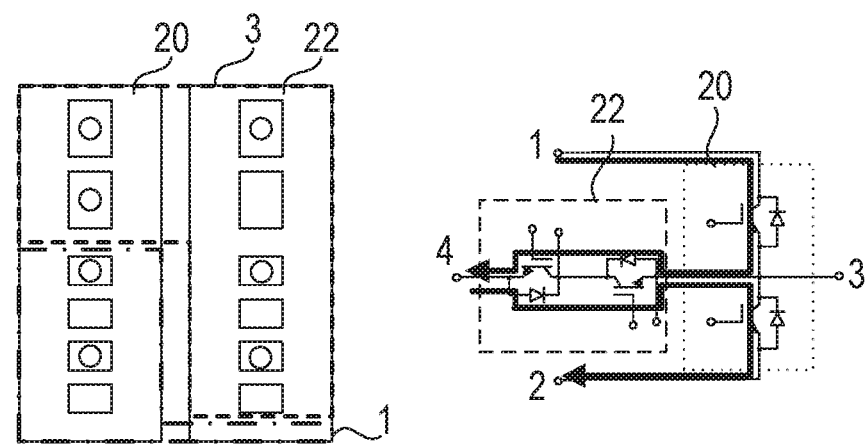
FIG. 18 schematically illustrates the arrangement of FIGS. 12B, 13B and 14B with a single half-bridge module, and the resulting current directions in the arrangement of FIG. 2.

The same applies for the arrangements of FIGS. 17 and 18, with FIG. 17 exemplarily illustrating the current paths in the arrangement of FIG. 2, when the common collector module 22 of FIGS. 5 to 7 is used, and FIG. 18 exemplarily illustrating the current paths in the arrangement of FIG. 2, when the common collector module 22 of FIG. 8 is used. Referring to FIG. 17, the resulting stray inductance in the upper path may be about 57.7 nH, and the resulting stray inductance of the lower path may be about 58.2 nH. Referring to FIG. 18, the resulting stray inductance in the upper path be about 25.1 nH, and the resulting stray inductance in the lower path may be about 26.6 nH. That is, the stray inductance may also be at least halved with the common collector module 22 of FIGS. 8 to 10.

Figure 19:
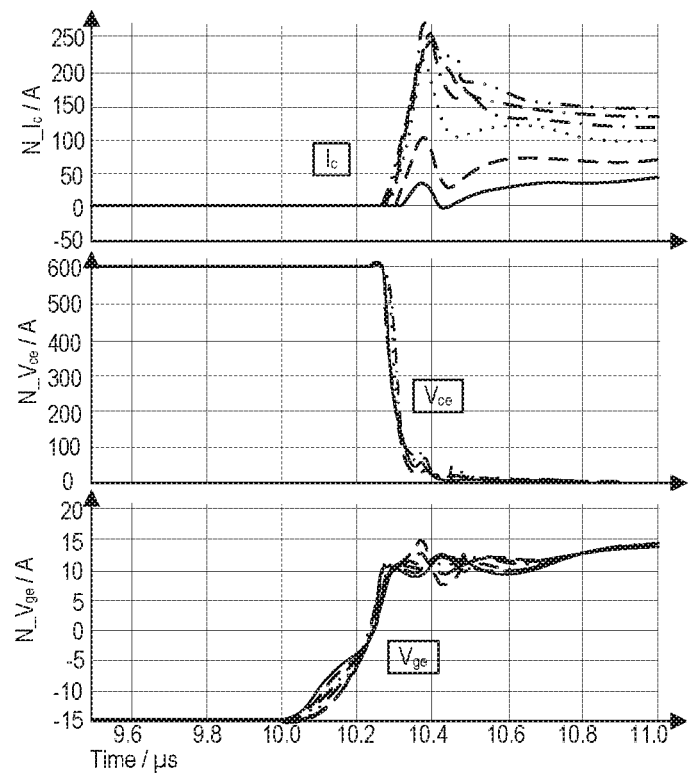
FIG. 19 illustrates resulting currents and voltages during turn-on of the semiconductor switches in the arrangement of FIG. 5

Further, when using the common collector module 22 of FIGS. 8 to 10 in the arrangement of FIG. 2 or 3, the switch-on characteristics of the third switch S3 and the fourth switch S4 may be improved as compared to the arrangement of FIGS. 5 to 7. This is schematically illustrated in the graphs illustrated in FIGS. 19 and 20. FIG. 19 schematically illustrates collector currents $I_c$, collector-emitter voltages $V_{ce}$, and gate-emitter voltages $V_{ge}$ for the different substrates 10 of a semiconductor arrangement according to FIG. 6. As can be seen, the scattering between the different substrates is relatively large, especially for the collector current $I_c$. For two of the substrates 10 (solid line and dashed line in top graph of FIG. 19), the collector current Ic is comparatively low. The collector current $I_c$ depends on the corresponding gate-emitter voltage $V_{ge}$. The gate-emitter voltage $V_p$ is affected by inductive effects occurring on the respective substrate 10. Switching losses occurring in a switch are generally proportional to the collector current $I_c$. Therefore, such substrates 10 having a higher collector current $I_c$ generate higher switching losses and, therefore, generate more heat.

Figure 20:
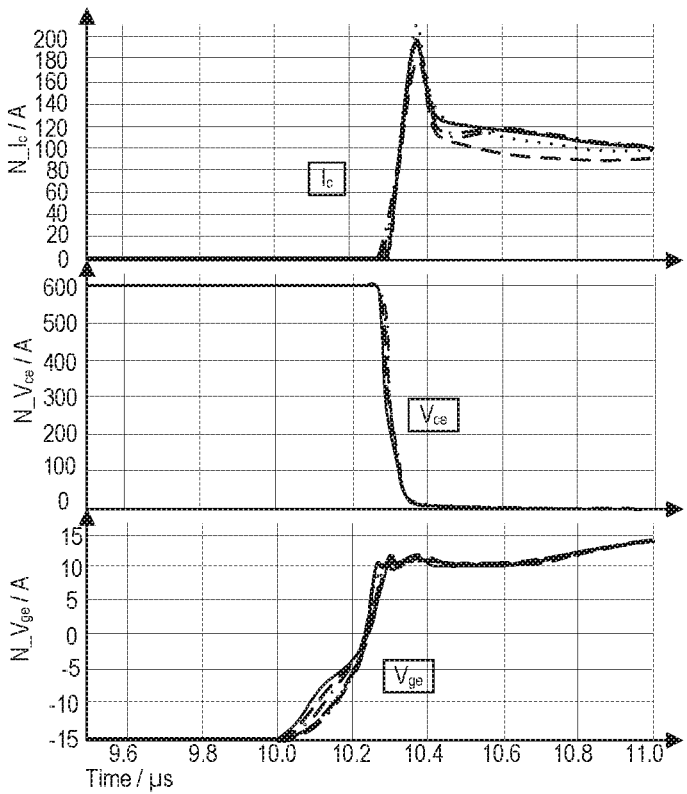
FIG. 20 illustrates resulting currents and voltages during turn-on of the semiconductor switches in the arrangement of FIG. 8.

FIG. 20 schematically illustrates the collector currents $I_c$, the collector-emitter voltages $V_{ce}$, and the gate-emitter voltages $V_{ge}$ for the different substrates 10 of a semiconductor arrangement according to FIG. 9. As can be seen, the scattering between the different substrates is substantially reduced as compared to the arrangement of FIG. 6, especially for the collector current $I_c$. As is illustrated in FIG. 20, the current distribution within the arrangement of FIG. 9 is much more homogenous. The switching behavior of the switches of the different semiconductor substrates 10, therefore, is also much more homogenous.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor substrate, comprising:
a dielectric insulation layer and a structured first metallization layer attached to the dielectric insulation layer;
a first switching element comprising a first load path between a first emitter terminal and a first collector terminal;
a second switching element comprising a second load path between a second emitter terminal and a second collector terminal;
a first diode element comprising a first anode terminal and a first cathode terminal; and
a second diode element comprising a second anode terminal and a second cathode terminal,
wherein the structured first metallization layer comprises at least five separate sections that are dielectrically insulated from each other,
wherein the first switching element, the second switching element, the first diode element, and the second diode element are arranged on a first section of the at least five separate sections, wherein the first collector terminal, the second collector terminal, the first cathode terminal and the second cathode terminal are electrically coupled to the first section,
wherein the first anode terminal and the first emitter terminal are electrically coupled to each other and further to a second section and to a third section of the at least five separate sections,
wherein the second anode terminal and the second emitter terminal are electrically coupled to each other and further to a fourth section and to a fifth section of the at least five separate sections,
wherein the second and the fourth section are arranged adjacent each other,
wherein the third and the fifth section are arranged adjacent each other,
wherein the first section separates the second and the fourth section from the third and the fifth section.

2. The semiconductor substrate of claim 1, wherein:
a first electrically conductive connection layer is arranged between the first collector terminal and the first section;
a second electrically conductive connection layer is arranged between the second collector terminal and the first section;
a third electrically conductive connection layer is arranged between the first cathode terminal and the first section; and
a fourth electrically conductive connection layer is arranged between the second cathode terminal and the first section.

3. The semiconductor substrate of claim 1, wherein:
an electrical connection electrically connecting the first anode terminal and the first emitter terminal to each other and further to the second section and to the third section of the structured first metallization layer comprises at least one bonding wire; and
an electrical connection electrically connecting the second anode terminal and the second emitter terminal to each other and further to the fourth section and to the fifth section of the structured first metallization layer comprises at least one bonding wire.

4. The semiconductor substrate of claim 1, wherein each of the first switching element and the second switching element comprises a transistor device, and wherein the transistor device is implemented as a MOSFET or an IGBT.

5. The semiconductor substrate of claim 1, wherein the second section and the third section have a same first potential and are arranged at opposite ends of the semiconductor substrate.

6. The semiconductor substrate of claim 5, wherein the fourth section and the fifth section have a same second potential and are arranged at opposite ends of the semiconductor substrate, and wherein the second potential is different from the first potential.

7. A semiconductor arrangement comprising a plurality of semiconductor substrates according to claim 1, wherein:
the plurality of semiconductor substrates is arranged in one row such that the first sections of the structured first metallization layer of the plurality of semiconductor substrates are arranged in a first row;
the second sections and the third sections of the structured first metallization layer of the plurality of semiconductor substrates are arranged in a second row in parallel to the first row; and
the fourth sections and the fifth sections of the structured first metallization layer of the plurality of semiconductor substrates are arranged in a third row in parallel to the first row and the second row.

8. The semiconductor arrangement of claim 7, wherein:
the second sections and the third sections of the structured first metallization layer of the plurality of semiconductor substrates are arranged alternatingly within the second row; and
the fourth sections and the fifth sections of the structured first metallization layer of the plurality of semiconductor substrates are arranged alternatingly within the third row.

9. The semiconductor arrangement of claim 7, further comprising:
a first conductor rail electrically connecting the second sections of the plurality of semiconductor substrates;
a second conductor rail electrically connecting the fifth sections of the plurality of semiconductor substrates;
a third conductor rail electrically connecting the fourth sections of the plurality of semiconductor substrates; and
a fourth conductor rail electrically connecting the third sections of the plurality of semiconductor substrates.

10. The semiconductor arrangement of claim 9, wherein each of the conductor rails comprises at least one tap for electrically contacting the respective conductor rail.

11. The semiconductor arrangement of claim 9, wherein:
the third conductor rail and the second conductor rail are arranged between the first conductor rail and the fourth conductor rail;
a distance between the first conductor rail and the third conductor rail in a first horizontal direction is less than a distance between the third conductor rail and the second conductor rail in a same direction; and
a distance between the second conductor rail and the fourth conductor rail in the first horizontal direction is less than a distance between the third conductor rail and the second conductor rail in a same direction.

12. The semiconductor arrangement of claim 11, wherein:
the distance between the first conductor rail and the third conductor rail in the first horizontal direction is less than 50%, less than 30% or less than 15% of the distance between the third conductor rail and the second conductor rail in the same direction; and
the distance between the second conductor rail and the fourth conductor rail in the first horizontal direction is less than 50%, less than 30% or less than 15% than the distance between the third conductor rail and the second conductor rail in the same direction.

13. The semiconductor arrangement of claim 11, wherein the first conductor rail and the third conductor rail have different potentials.

14. The semiconductor arrangement of claim 11, wherein the second conductor rail and the fourth conductor rail have different potentials.

15. The semiconductor arrangement of claim 7, further comprising a base plate on which the plurality of semiconductor substrates is arranged.

16. The semiconductor arrangement of claim 15, wherein the base plate either forms a bottom of a housing or is arranged within the housing.

* * * * *